United States Patent
Park et al.

(10) Patent No.: US 8,398,769 B2
(45) Date of Patent: Mar. 19, 2013

(54) CHEMICAL VAPOR DEPOSITION APPARATUS

(75) Inventors: Sang Ki Park, Yongin-si (KR); Jung Min Ha, Gwangju-si (KR); Seong Ryong Hwang, Seoul (KR)

(73) Assignee: Jusung Engineering Co., Ltd. (KR)

( * ) Notice: Subject to any disclaimer, the term of this patent is extended or adjusted under 35 U.S.C. 154(b) by 324 days.

(21) Appl. No.: 12/789,075

(22) Filed: May 27, 2010

(65) Prior Publication Data

US 2010/0307416 A1    Dec. 9, 2010

(30) Foreign Application Priority Data

Jun. 4, 2009   (KR) .................... 10-2009-0049423

(51) Int. Cl.
*C23C 16/00* (2006.01)
*C23F 1/00* (2006.01)
*H01L 21/306* (2006.01)

(52) U.S. Cl. .................. 118/715; 118/724; 156/345.33; 156/345.34

(58) Field of Classification Search .................. 118/715, 118/724, 725; 156/345.33, 345.34, 345.37
See application file for complete search history.

(56) References Cited

U.S. PATENT DOCUMENTS

| | | | | |
|---|---|---|---|---|
| 3,854,443 | A * | 12/1974 | Baerg | 118/724 |
| 7,255,115 | B2 * | 8/2007 | Kwon et al. | 134/102.2 |
| 2004/0134611 | A1 * | 7/2004 | Kato et al. | 156/345.33 |
| 2004/0191413 | A1 * | 9/2004 | Park et al. | 427/255.28 |
| 2008/0035603 | A1 * | 2/2008 | Lee et al. | 216/13 |
| 2008/0093341 | A1 * | 4/2008 | Turlot et al. | 216/71 |
| 2009/0136652 | A1 * | 5/2009 | Washington et al. | 427/8 |

* cited by examiner

*Primary Examiner* — Rakesh Dhingra
(74) *Attorney, Agent, or Firm* — The Law Offices of Andrew D. Fortney; Andrew D. Fortney

(57) ABSTRACT

A chemical vapor deposition apparatus is disclosed, which is capable of improving the yield by an extension of a cleaning cycle, the chemical vapor deposition apparatus comprising a chamber with a substrate-supporting member for supporting a substrate; a chamber lid with plural first source supplying holes, the chamber lid installed over the chamber; plural source supplying pipes for supplying a process source to the plural first source supplying holes; a spraying-pipe supporting member with plural second source supplying holes corresponding to the plural first source supplying holes, the spraying-pipe supporting member detachably installed in the chamber lid; and plural source spraying pipes with plural third source supplying holes and plural source spraying holes, the plural source spraying pipes supported by the spraying-pipe supporting member, wherein the plural third source supplying holes are supplied with the process source through the plural second source supplying holes, and the plural source spraying holes are provided to spray the process source onto the substrate.

27 Claims, 7 Drawing Sheets

CHEMICAL VAPOR DEPOSITION APPARATUS

CROSS REFERENCE TO RELATED APPLICATIONS

This application claims the benefit of the Korean Patent Application No. P2009-0049423 filed on Jun. 4, 2009, which is hereby incorporated by reference as if fully set forth herein.

BACKGROUND OF THE INVENTION

1. Field of the Invention

The present invention relates to a chemical vapor deposition apparatus, and more particularly, to a chemical vapor deposition apparatus capable of improving the yield by an extension of a cleaning cycle.

2. Discussion of the Related Art

Generally, a physical vapor deposition (PVD) method using a physical reaction such as sputtering, or a chemical vapor deposition (CVD) method using a chemical reaction is used to deposit a thin film having a predetermined thickness on a substrate (for example, wafer, plastic substrate, or glass) of a solar cell, a semiconductor device, or a flat display panel.

In case of the CVD method, a gaseous ingredient material is firstly supplied to a processing chamber, and then a desired thin film is deposited on a substrate (or wafer) by a chemical reaction. As the CVD method is advantageous in that it obtains good deposition properties such as good step coverage of thin film on the substrate, and good uniformity and yield in comparison to the PVD method, the CVD method is widely used in many fields. The CVD method may be largely classified into a low pressure chemical vapor deposition (LPCVD), an atmospheric pressure chemical vapor deposition (APCVD), a low temperature chemical vapor deposition (LTCVD), a plasma enhanced chemical vapor deposition (PECVD), and a metal organic chemical vapor deposition (MOCVD).

FIG. 1 illustrates a chemical vapor deposition apparatus according to the related art.

As shown in FIG. 1, the chemical vapor deposition apparatus according to the related art includes a chamber 10 with a substrate-supporting member 14 for supporting a substrate 12; a chamber lid 20 installed over the chamber 10; and a source spraying member 30 for spraying a process source toward the substrate 12, wherein the source spraying member 30 is installed inside the chamber 10 while penetrating the chamber lid 20.

The chamber 10 provides a predetermined reaction space. At one side of the chamber 10, there is an exhaust hole (not shown) for exhausting the process source.

The substrate-supporting member 14 is installed at the inner bottom of the chamber 10, wherein the substrate-supporting member 14 supports the substrate 12 provided from the external.

The chamber lid 20 is installed over the chamber 10, wherein the chamber lid 20 seals the reaction space of the chamber 10. At this time, a sealing member 115 may be installed between the chamber 10 and the chamber lid 20.

The source spraying member 30 includes a source supplying pipe 32, plural source spraying pipes 34, and plural source spraying holes 36.

The source supplying pipe 32 penetrates the chamber lid 20, and the source supplying pipe 32 is branched into branch-pipes for being in communication with the plural source spraying pipes 34.

The plural source spraying pipes 34 are arranged at fixed intervals inside the chamber 10, and the plural source spraying pipes 34 are in communication with the branched branch-pipes of the source supplying pipe 32, whereby the plural source spraying pipes 34 are supplied with the process source from the source supplying pipe 32.

The plural source spraying holes 36 are arranged at fixed intervals in the respective source spraying pipes 34, whereby the process source (S) supplied to the source spraying pies 34 is sprayed onto the substrate 12 through the plural source spraying holes 36.

In the chemical vapor deposition apparatus according to the related art, under the inside of the chamber 10 is maintained at a constant temperature, the process source is sprayed to the reaction space through the source spraying member 30, whereby a thin film material is deposited on the substrate 12.

If applying the aforementioned thin film deposition process, the thin film material is deposited on undesired portions as well as on the substrate 12. For example, the thin film material might be deposited on inner walls of the chamber 10; predetermined portions in upper surface and/or lateral surface of the substrate-supporting member 14 except portions for supporting the substrate 12; and a lower surface of the source spraying member 30. Especially, if the thin film material is deposited on the circumference of the source spraying hole 36, a size of the source spraying hole 36 might be changed so that it is difficult to form a uniform thin film on the substrate 12.

In order to form the uniform thin film on the substrate 12, it is necessary to cyclically clean the circumference of the source spraying hole 36, to thereby remove the thin film material from the circumference of the source spraying hole 36.

However, whenever the aforementioned cleaning process is needed, the chemical vapor deposition apparatus according to the related art should be turned off. Then, after disassembling the chemical vapor deposition apparatus, the source spraying member 30 is separated from the chamber lid 20, and then the cleaning process is carried out to remove the thin film material from the circumference of the source spraying hole 36. These complicated cleaning steps inevitably cause the decrease of operable time in the apparatus, thereby lowering operability of the apparatus. Furthermore, after completing the cleaning process of the source spraying member 30, additional steps are needed to remove moisture and foreign matters from the inside of the chamber 10, and to adjust the inside of the chamber 10 to a stable pressure and temperature. In addition, a test deposition process has to be applied to a dummy substrate so as to check uniformity and particle-contamination level in the thin film deposited thereon, which causes reduction of throughput since many hours are consumed for the test deposition process.

Eventually, in consideration for the yield, it is preferable to extend a cleaning cycle of the source spraying member 30 as long as possible.

SUMMARY OF THE INVENTION

Accordingly, the present invention is directed to a chemical vapor deposition apparatus that substantially obviates one or more problems due to limitations and disadvantages of the related art.

An advantage of the present invention is to provide a chemical vapor deposition apparatus capable of improving the yield by an extension of a cleaning cycle.

Additional features and aspects of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a chemical vapor deposition apparatus comprising a chamber with a substrate-supporting member for supporting a substrate; a chamber lid with plural first source supplying holes, the chamber lid installed over the chamber; plural source supplying pipes for supplying a process source to the plural first source supplying holes; a spraying-pipe supporting member with plural second source supplying holes corresponding to the plural first source supplying holes, the spraying-pipe supporting member detachably installed in the chamber lid; and plural source spraying pipes with plural third source supplying holes and plural source spraying holes, the plural source spraying pipes supported by the spraying-pipe supporting member, wherein the plural third source supplying holes are supplied with the process source through the plural second source supplying holes, and the plural source spraying holes are provided to spray the process source onto the substrate.

At this time, the chamber lid comprises a base in which the plural first source supplying holes are formed; a supporting-member installing portion in which the spraying-pipe supporting member is detachably installed, the supporting-member installing portion formed in a rear surface of the base; and a cooling-member installing portion in which a cooling member for cooling a temperature of the spraying-pipe supporting member is installed, the cooling-member installing portion formed in the base.

In addition, the chemical vapor deposition apparatus further comprises a jacket with plural openings corresponding to the plural source supplying pipes, the jacket detachably installed in a rear surface of the chamber lid.

In another aspect of the present invention, there is provided a chemical vapor deposition apparatus comprising a chamber with a substrate-supporting member for supporting a substrate; a chamber lid installed over the chamber; a source spraying member for spraying an externally-provided process source onto the substrate, the source spraying member detachably installed in the chamber lid; and a cooling member for cooling a temperature of the source spraying member, the cooling member installed inside the chamber lid.

At this time, the chamber lid comprises a base; plural first source supplying holes for supplying the process source to the source spraying member, the plural first source supplying holes formed at fixed intervals by penetrating the base; a supporting-member installing portion in which the source spraying member is detachably installed, the supporting-member installing portion formed in a rear surface of the base; and a cooling-member installing portion in which the cooling member is installed, the cooling-member installing portion formed in the base.

Also, the source spraying member comprises plural source spraying pipes arranged at fixed intervals; a spraying-pipe supporting member for supporting the plural source spraying pipes, the spraying-pipe supporting member detachably installed in the base; plural second source supplying holes formed in the spraying-pipe supporting member to be corresponding to the plural first source supplying holes; plural third source supplying holes formed in the respective source spraying pipes to be corresponding to the plural second source supplying holes; and plural source spraying holes for spraying the process source onto the substrate, the plural source spraying holes formed at fixed intervals in the respective source spraying pipes.

In addition, the chemical vapor deposition apparatus further comprises a jacket with plural openings corresponding to the plural source supplying pipes, the jacket detachably installed in a rear surface of the chamber lid.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a chemical vapor deposition apparatus according to the present invention will be described with reference to the accompanying drawings.

Figure 1:
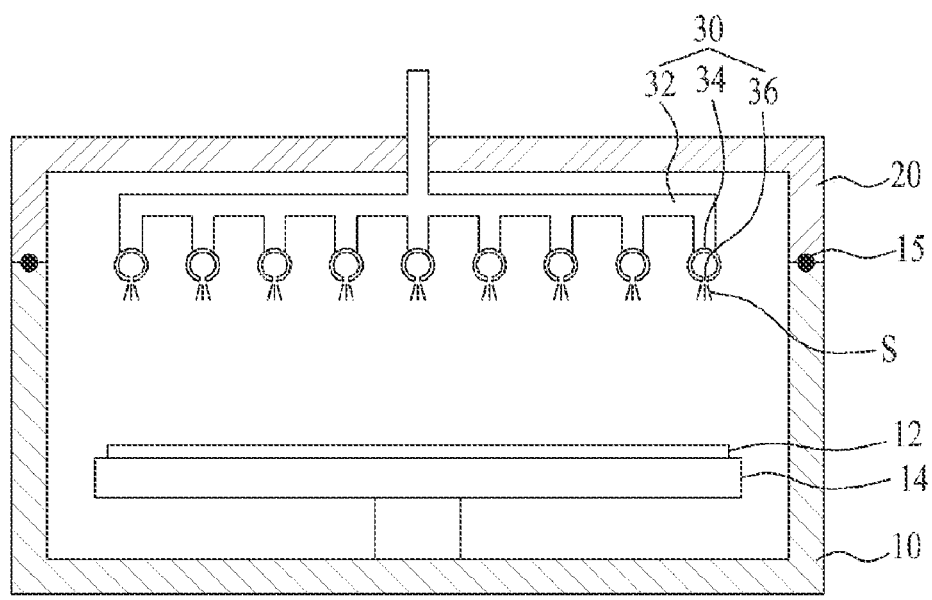
FIG. 1 illustrates a chemical vapor deposition apparatus according to the related art.
Figure 2:
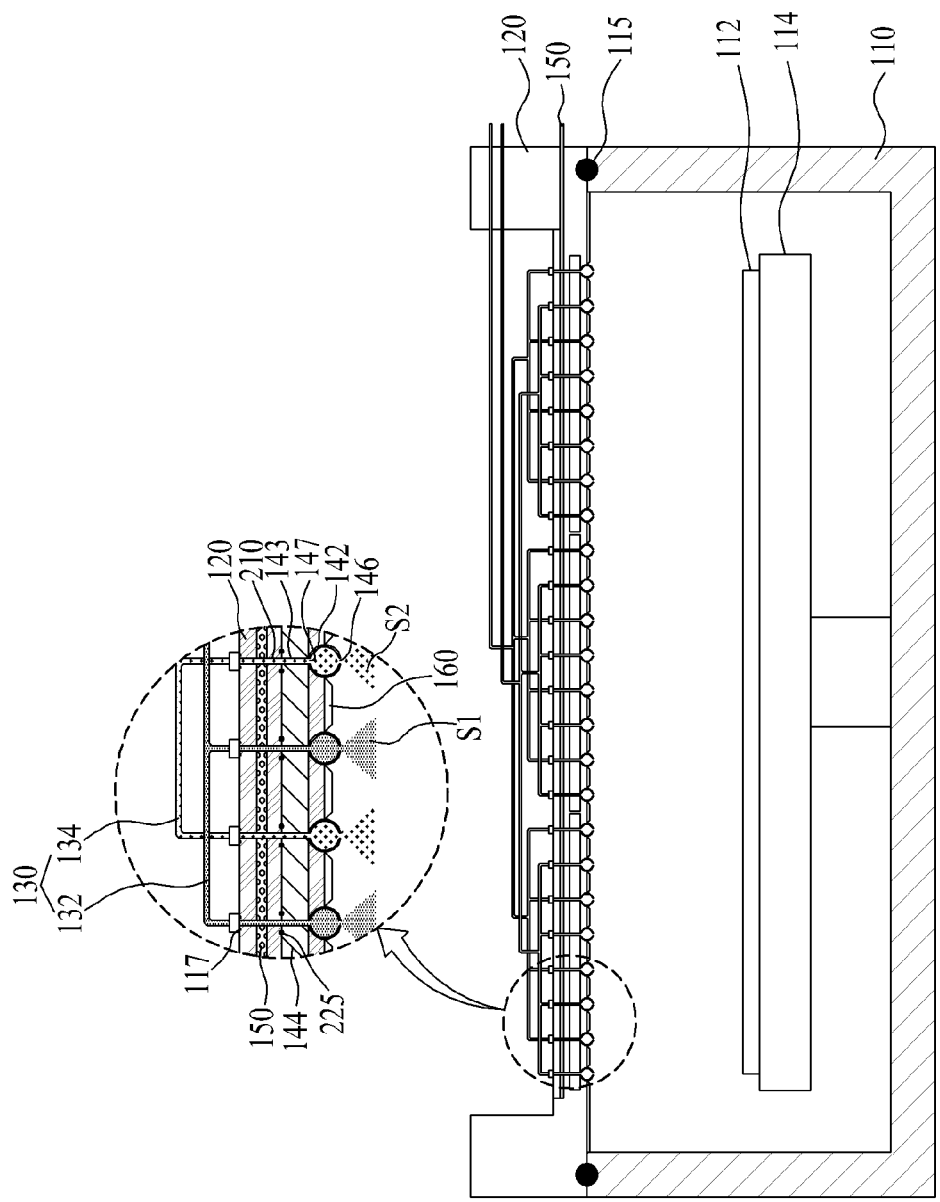
FIG. 2 is a perspective view illustrating a chemical vapor deposition apparatus according to the embodiment of the present invention.
Figure 3:
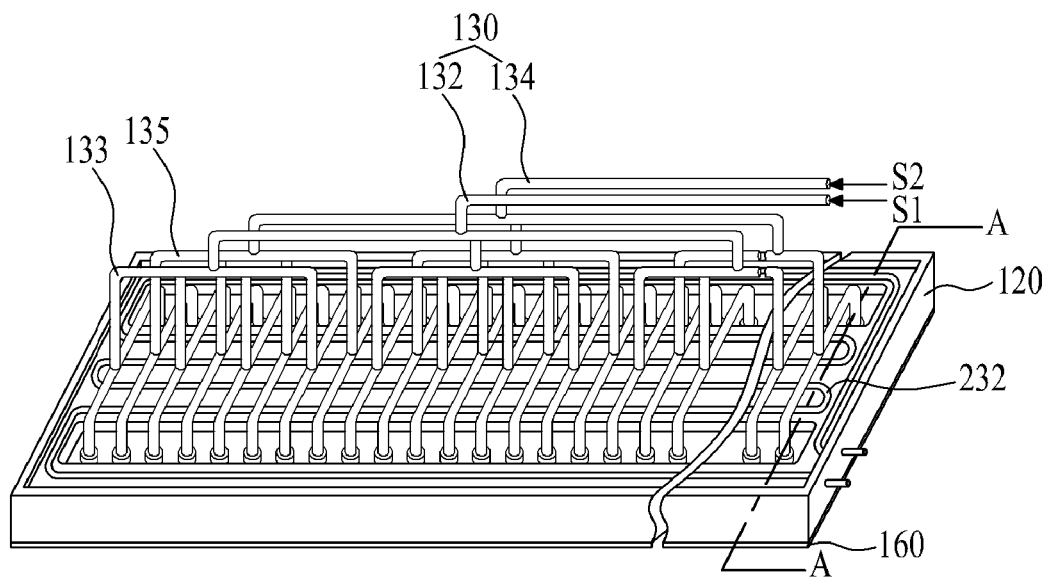
FIG. 3 is a perspective view illustrating an upper structure of a chamber in the chemical vapor deposition apparatus according to the embodiment of the present invention.
Figure 4:
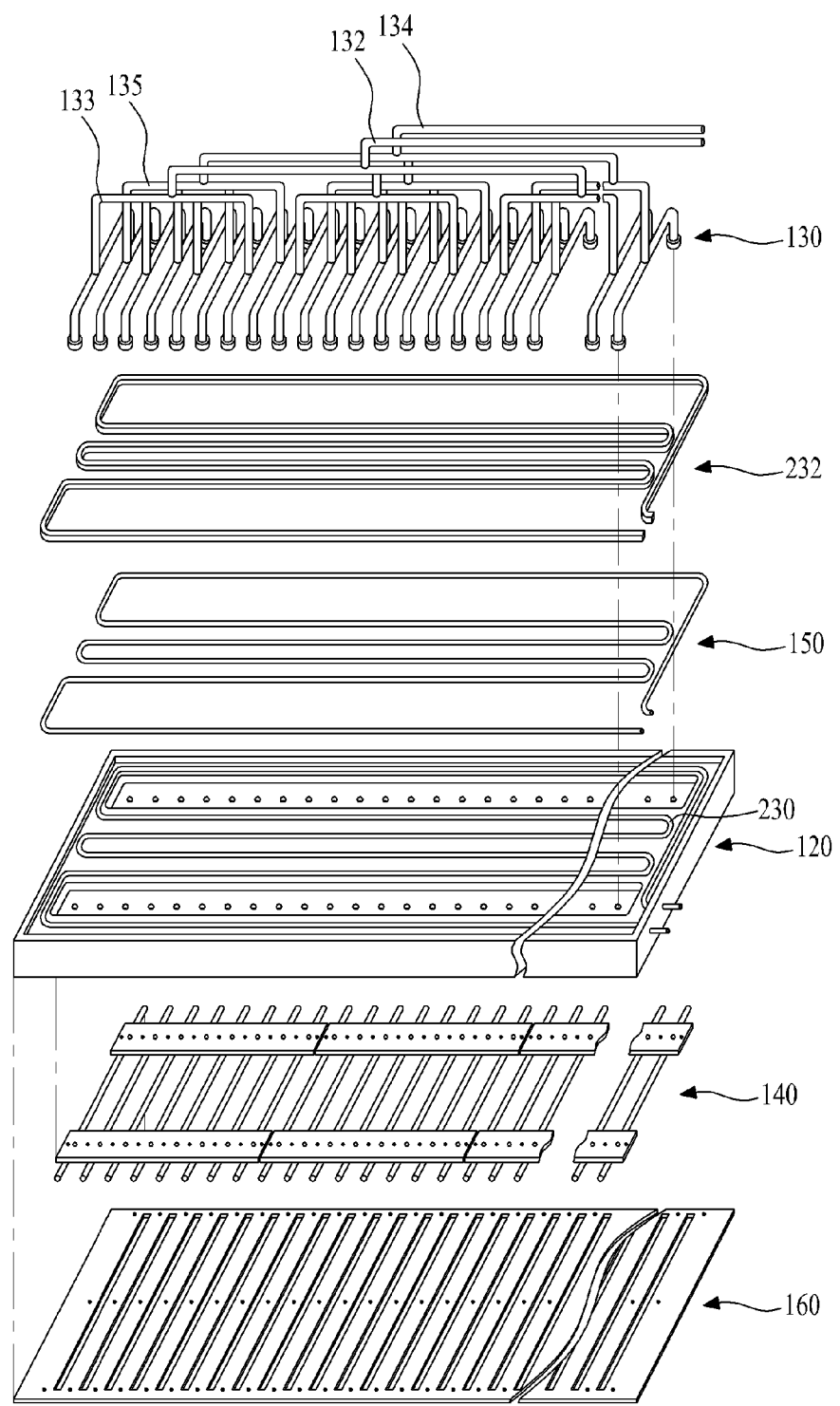
FIG. 4 is an exploded perspective view illustrating the upper structure of the chamber shown in FIG. 3.

FIG. 2 illustrates a chemical vapor deposition apparatus according to the embodiment of the present invention. FIG. 3 is a perspective view illustrating an upper structure of a chamber in the chemical vapor deposition apparatus according to the embodiment of the present invention. FIG. 4 is an exploded perspective view illustrating the upper structure of the chamber shown in FIG. 3.

Referring to FIGS. 2 to 4, the chemical vapor deposition apparatus according to the embodiment of the present invention includes a chamber 110, a chamber lid 120, a source supplying pipe 130, a source spraying member 140, and a cooling member 150. At this time, the chamber 110 includes a substrate-supporting member 114 for supporting a substrate 112. The chamber lid 120 is installed above the chamber 110. The source supplying pipe 130 is connected to the chamber lid 120, wherein the source supplying pipe 130 supplies a process source to the chamber lid 120. The source spraying member 140 is detachably installed in the chamber lid 120, wherein the source spraying member 140 sprays the process source supplied from the source supplying pipe 130 onto the substrate 112. The cooling member 150 is installed inside the chamber lid 120, wherein the cooling member 150 adjusts a temperature of the source spraying member 140.

The chamber 110 provides a predetermined reaction space. At one side of the chamber 110, there is an exhaust hole (not shown) for exhausting the source.

The substrate-supporting member 114 is installed at the inner bottom of the chamber 110, wherein the substrate-supporting member 114 supports the substrate 112 provided from the external. The substrate-supporting member 114 may include a substrate-heating member (not shown) so as to maintain the substrate 112 at 80° C.~250° C.

The chamber lid 120 for sealing the reaction space of the chamber 110 is installed above the chamber 110. At this time, a sealing member 115 may be installed between the chamber 110 and the chamber lid 120.

The source supplying pipe 130 is installed at an upper part of the chamber lid 120, wherein the source supplying pipe 130 supplies the process source from an external source supplying apparatus (not shown) to the chamber lid 120.

The source supplying pipe 130 may be supplied with a process source to be used for a thin-film deposition process in the chamber 110. For example, if a ZnO-based thin film is formed on the substrate 112, the source supplying pipe 130 may include a first source supplying pipe 132 for supplying a first process source (S1), and a second source supplying pipe 134 for supplying a second process source (S2). In this case, the first process source (S1) may be $H_2O$, and the second process source (S2) may be DEZ (Diethyl Zinc, DEZ).

The first source supplying pipe 132 may include 'M' first branch-pipes 133, which are grouped into units, each unit comprising 'N' of the first branch-pipes 133; and the second source supplying pipe 134 may include 'M' second branch-pipes 135, which are grouped into units, each unit comprising 'N' of the second branch-pipes 135. The chemical vapor deposition apparatus may include from 2 to 500 source supplying pipes. In this case, the first branch-pipe 133 and second branch-pipe 135 are alternately installed in the chamber lid 120, but it is not limited to this structure. The first branch-pipe 133 and second branch-pipe 135 may be installed in any structure facilitating to uniformly spray the process source to the reaction space. At this time, a sealing member 117 may be installed between the source supplying pipe 132 and the chamber lid 120.

Figure 5A:
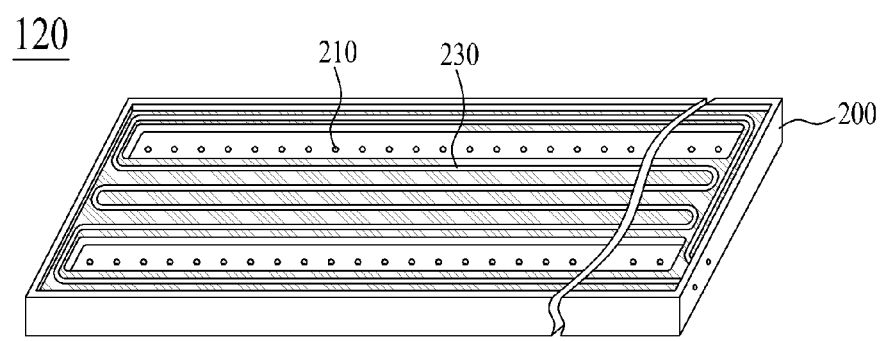
FIGS. 5A and 5B are perspective views illustrating a chamber lid shown in FIG. 4.
Figure 5B:
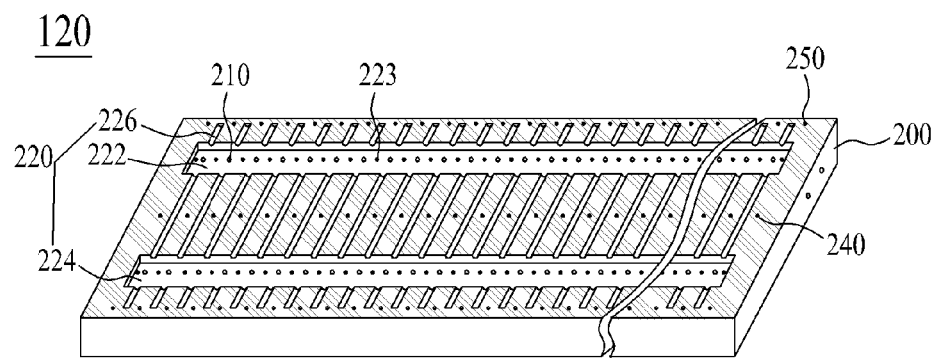

As shown in FIGS. 5A and 5B, the chamber lid 120 includes a base 200, plural first source supplying holes 210, a portion for installment of source spraying member 220, and a portion for installment of cooling member 230.

The base 200 of metal material is installed over the chamber 110, and the base 200 seals the reaction space inside the chamber 110.

While being in communication with the source supplying pipe 130, the plural first source supplying holes 210 are formed at fixed intervals along lower and upper sides of the base 200 (that is, two longitudinal sides of the base 200). Through each of the plural first source supplying holes 210, the process source supplied from the source supplying pipe 130 is supplied to the source spraying member 140. At this time, when the source supplying pipe 130 is installed in the base 200, each source supplying pipe 130 meets with each of the plural first source supplying holes 210 through a screw coupled to the base 200 by a flange installed at an end of the source supplying pipe 130.

Among the plural first source supplying holes 210, the odd-numbered first source supplying hole 210 is in communication with each of the 'M' first branch-pipes 133; and the even-numbered first source supplying hole 210 is in communication with each of the 'M' second branch-pipes 135.

The portion for installment of source spraying member 220 is formed by grooving a rear surface of the base 200. The source spraying member 140 is inserted into and installed in the portion for installment of source spraying member 220. For this, the portion for installment of source spraying member 220 is provided with a first insertion groove 222, a second insertion groove 224, and plural third insertion grooves 226.

The first insertion groove 222 is formed in parallel to the longitudinal side of the base 200, and more particularly, the first insertion groove 222 is formed at the upper longitudinal side of the base 200.

The second insertion groove 224 is opposite to the first insertion groove 222, that is, the second insertion groove 224 is formed at the lower longitudinal side of the base 200.

The plural first source supplying holes 210 are formed at fixed intervals in the respective first and second insertion grooves 222 and 224.

Also, plural first screw holes 223 are formed in the respective first and second insertion grooves 222 and 224. Each of the plural first screw holes 223 is coupled to each of the plural screws (not shown) for detachably installing the source spraying member 140 in the chamber lid 120.

The plural third insertion grooves 226 are perpendicular to the first and second insertion grooves 222 and 224. The plural third insertion grooves 226 include the plural first source supplying holes 210 formed in the first and second insertion grooves 222 and 224. At this time, each of the plural third insertion grooves 226 may have a semicircle-shaped cross section.

In addition, the base 200 includes second screw holes 240 and third screw holes 250. Each of the second screw holes 240 is formed between each of the plural first source supplying holes 210 in the first insertion groove 222 and each of the plural first source supplying holes 210 in the second insertion groove 224. The third screw holes 250 are formed adjacent to both ends and central portion of each of the plural third insertion grooves 226.

The portion for installment of cooling member 230 is formed by grooving an upper surface of the base 200, wherein the portion for installment of cooling member 230 is formed in a multi-bend shape (for example, multiple S shape with linear parts and bent parts). The cooling member 150 is inserted into and installed in the portion for installment of cooling member 230. At this time, the portion for installment of cooling member 230 may have a U-shaped cross section. Preferably, the portion for installment of cooling member 230 is positioned near to the plural third insertion grooves 226.

According to the structure of the base 200, the portion for installment of cooling member 230 may be provided in such a way that each of the linear parts included in the portion for installment of cooling member 230 may be arranged in-between the plural third insertion grooves 226, or the linear parts included in the portion for installment of cooling member 230 may be arranged in parallel to the first and second insertion grooves 222 and 224.

Figure 6:
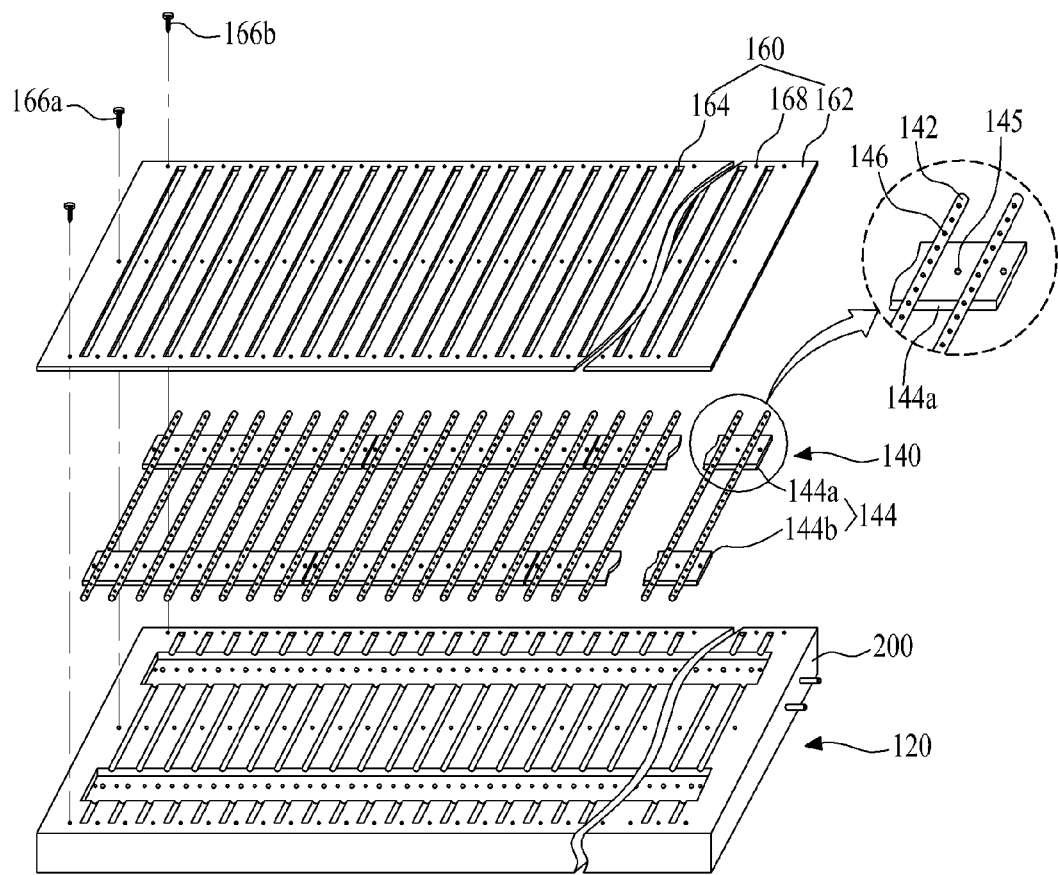
FIG. 6 is an exploded perspective view illustrating a source spraying member shown in FIG. 4.

As shown in FIG. 6, the source spraying member 140 of FIG. 4 includes plural source spraying pipes 142, a spraying-pipe supporting member 144, and plural source spraying holes 146.

The plural source spraying pipes 142 are installed on the spraying-pipe supporting member 144, wherein the plural source spraying pipes 142 are respectively inserted into the plural third insertion grooves 226 in the chamber lid 120. The plural source spraying pipes 142 are supplied with the process source through the source supplying pipe 130, the first source supplying hole 210, and the spraying-pipe supporting member 144.

The spraying-pipe supporting member 144 supports the plural source spraying pipes 142 provided in groups of 'N', that is, supports each group comprising 'N' of the source spraying pipes 142. For this, the spraying-pipe supporting member 144 may be provided with plural first and second plates 144a and 144b.

The plural first and second plates 144a and 144b are detachably installed while confronting the first and second insertion grooves 222 and 224 in the base 200. Thus, the plural first and second plates 144a and 144b support both ends of each of the plural source spraying pipes 142 provided in groups of 'N'. At this time, the first and second plates 144a and 144b and the source spraying pipes 142 are joined together by welding.

In order to supply the process source from the first source supplying holes 210 to the respective source spraying pipes 142, the plural first and second plates 144a and 144b are provided with plural second source supplying holes 143 (see FIG. 2) which are in communication with the respective first source supplying holes 210; and each of the plural source spraying pipes 142 is provided with a third source supplying hole 147 (see FIG. 2) supplied with the process source from the second source supplying holes 143. Accordingly, the process source is supplied to the plural source spraying pipes 142 through the first to third source supplying holes 210, 143, and 147.

Also, through-holes 145 are formed at fixed intervals in each of the plural first and second plates 144a and 144b. In this case, a screw (not shown) coupled to the first screw hole in each of the first and second insertion grooves 222 and 224 is inserted into the through-hole 145. Accordingly, the plural first and second plates 144a and 144b are respectively inserted into the through-holes 145, and are detachably installed in the chamber lid 120 by the coupling of the screw coupled to the first screw hole. In this case, a sealing member 225 is installed between the first insertion groove 222 and the plural first plates 144a, to thereby seal the circumstance of the plural second source supplying holes 143 in the first insertion groove 222. In the same way, the aforementioned sealing member 225 is installed between the second insertion groove 224 and the plural second plates 144b, to thereby seal the circumstance of the plural second source supplying holes 143 in the second insertion groove 224.

The plural source spraying holes 146 are formed in each of the source spraying pipe 142, to thereby spray the process source supplied to the source spraying pipe 142 onto the substrate 112. In this case, as shown in FIG. 2, the process source is supplied to each source spraying pipe 142 through the source supplying pipe 120, and the first to third source supplying holes 210, and is then sprayed at a predetermine spraying angle toward the substrate 112, wherein the predetermined spraying angle is made through each source spraying hole 146.

The source spraying member 140 is inserted into, and is detachably installed in the first and second insertion grooves 222 and 224 in the rear surface of the chamber lid 120, to thereby spray the process sources (S1, S2) onto the substrate 112.

In FIG. 4, the cooling member 150 is formed in a multi-bend shape (for example, multiple S shape with linear parts and bent parts), as shown in FIG. 7A; and the cooling member 150 is inserted into the portion for installment of cooling member 230. The cooling member 150 inserted into the portion for installment of cooling member 230 circulates a cooling fluid, which is supplied from an external temperature controller (not shown), inside the chamber lid 120. At this time, the cooling member 150 may be a pipe; and the cooling fluid may be any one of air, source, and water maintained at a predetermined temperature.

As the cooling member 150 cools a temperature in the surface of the source spraying member 140 by circulating the cooling fluid, a temperature in the circumstance of the plural source spraying holes 146 is also cooled so that it is possible to prevent a thin film material from being deposited on the circumstance of the plural source spraying holes 146 for a chemical vapor deposition process.

In addition, there may be a cover 232 for protecting the cooling member 150 inserted into the portion for installment of cooling member 230.

Figure 7:
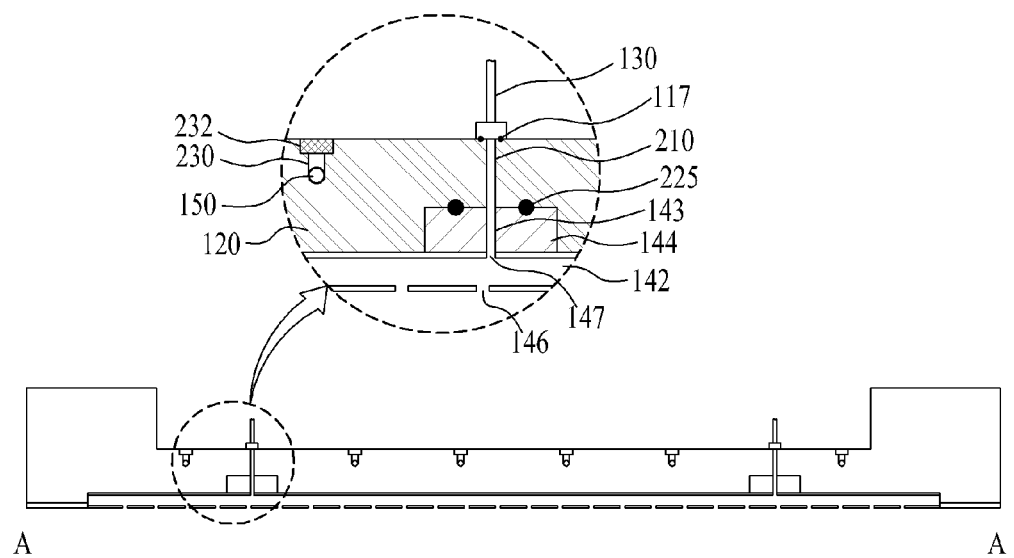
FIG. 7 is a cross section view along A-A of FIG. 3.

As shown in FIG. 7, the cover 232 is identical in shape to the portion for installment of cooling member 230. Thus, the cooling member 150 can be protected by sealing the top of the portion for installment of cooling member 230 into which the cooling member 150 is inserted, through the use of cover 232.

Also, the chemical vapor deposition apparatus according to the embodiment of the present invention may further include a jacket 160 for preventing the thin film material from being deposited on the rear surface of the chamber lid 120 for the chemical vapor deposition process.

As shown in FIGS. 4 and 6, the jacket 160 includes a jacket frame 162 with plural openings 164, and plural screw holes 168 for screws 166 to install the jacket frame 162 in the rear surface of the chamber lid 120.

The plural openings 164 are formed at fixed intervals in the jacket frame 162. When arranging the plural openings 164, a longitudinal direction of each opening 164 is identical to a longitudinal direction of each source spraying pipe 142. That is, the plural openings 164 are arranged in a stripe pattern. Also, each of the openings 164 is inserted into each of the third insertion grooves 226 of the chamber lid 120, to thereby expose the plural source spraying holes 146 respectively formed in the plural source spraying pipes 142.

The plural openings 164 may be formed in a hole-shape as to expose the plural source spraying holes 146.

When the plural screw holes 168 are formed in the jacket frame 162, the plural screw holes 168 are provided corresponding to the plural second screw holes 240 and third screw holes 250 in the base of the chamber lid 120.

The jacket 160 is detachably installed in the rear surface of the chamber lid 120 by plural first screws 166a inserted into the plural screw holes 168 and coupled to the plural second screw holes 240, and plural second screws 166b coupled to the plural third screw holes 250, to thereby prevent the rear surface of the chamber lid 120 from being contaminated by the thin film material for the chemical vapor deposition process. According to a contamination level based on the frequency of chemical vapor deposition process, the jacket 160 may be separated from the chamber lid 120, cleaned, and then installed in the chamber read 120 for reuse.

The chemical vapor deposition apparatus according to the embodiment of the present invention cools the temperature of the plural source spraying pipes 142 through the use of the cooling member 150 inside the chamber lid 120, so that it is possible to prevent the thin film material from being deposited on the circumference of the plural source spraying holes 146 for the chemical vapor deposition process. As a result, it is possible to improve the yield by extending a cleaning cycle of the source spraying member 140.

Also, the source spraying member 140 is detachably installed in the rear surface of the chamber lid 120. Thus, when it is needed to clean the contaminated source spraying member 140, the source spraying member 140 can be easily separated from the chamber lid 120, to thereby enhance operability owing to the increased operable time of the apparatus.

Under the circumstance that the plural source spraying pipes 142 are grouped into units, each unit comprising 'N' of the source spraying pipes 142, the plural source spraying pipes 142 are installed in the chamber lid 120 at once. This enables the easy installment or detachment of the source spraying member 140.

Accordingly, the chemical vapor deposition apparatus according to the present invention can improve the yield by extending the cleaning cycle of the source spraying member 140, and also enhance the operability by increasing the apparatus-operable time owing to the easy installment or detachment of the source spraying member 140 for the cleaning process of the source spraying member 140.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A chemical vapor deposition apparatus comprising:
   a chamber having a substrate-supporting member for supporting a substrate;
   a chamber lid over the chamber, the chamber lid having a plurality of first source supplying holes;
   a plurality of source supplying pipes for supplying a process source material to the plurality of first source supplying holes;
   a spraying-pipe supporting member with a plurality of second source supplying holes corresponding to the plurality of first source supplying holes, the spraying-pipe supporting member detachably installed in the chamber lid; and
   a plurality of source spraying pipes supported by the spraying-pipe supporting member, each of the plurality of source spraying pipes having a plurality of third source supplying holes and a plurality of source spraying holes, wherein the plurality of third source supplying holes are supplied with the process source material through the plurality of second source supplying holes, and the plurality of source spraying holes are provided to spray the process source material onto the substrate.

2. The chemical vapor deposition apparatus according to claim 1, wherein the chamber lid comprises:
   a base having the plurality of first source supplying holes therein;
   a supporting-member installation portion in a rear or interior surface of the base, in which the spraying-pipe supporting member is detachably installed; and
   a cooling-member installation portion in the base, in which a cooling member for cooling a temperature of the spraying-pipe supporting member is installed.

3. The chemical vapor deposition apparatus according to claim 2, wherein the supporting-member installation portion comprises:
   first insertion grooves parallel to each other in the rear or interior surface of the base, in which the spraying-pipe supporting member is detachably installed; and
   a plurality of second insertion grooves arranged at fixed intervals in the rear or interior surface of the base perpendicular to the first insertion grooves, wherein the plurality of source spraying pipes are installed in the plurality of second insertion grooves.

4. The chemical vapor deposition apparatus according to claim 2, wherein the cooling-member installation portion comprises grooves in a pattern having multiple bends in an upper surface of the base.

5. The chemical vapor deposition apparatus according to claim 2, further comprising a cover for covering the cooling member and the cooling-member installation portion in which the cooling member is installed.

6. The chemical vapor deposition apparatus according to claim 2, wherein the cooling member cools the spraying-pipe supporting member to a constant temperature by circulating an externally-provided cooling fluid.

7. The chemical vapor deposition apparatus according to claim 6, wherein the cooling fluid comprises air, source material, or water maintained at a predetermined temperature.

8. The chemical vapor deposition apparatus according to claim 1, further comprising a jacket having a plurality of openings corresponding to the plurality of source spraying pipes, the jacket detachably installed in a rear or interior surface of the chamber lid.

9. The chemical vapor deposition apparatus according to claim 8, wherein each of the plurality of openings has a rectangular shape corresponding to a shape of one of the plurality of source spraying pipes, or a hole shape corresponding to one of the plurality of third source supplying holes.

10. The chemical vapor deposition apparatus according to claim 1, further comprising a sealing member for sealing connections between the plurality of first source supplying holes and the plurality of source supplying pipes.

11. The chemical vapor deposition apparatus according to claim 1, wherein the plurality of source supplying pipes comprises from 2 to 500 source supplying pipes.

12. The chemical vapor deposition apparatus according to claim 1, wherein the plurality of source supplying pipes comprises:
    a first source supplying pipe for supplying a first process source material to a first set of the first source supplying holes; and
    a second source supplying pipe for supplying a second process source material to a second set of the first source supplying holes, the second set of the first source supplying holes differing from the first set of the first source supplying holes.

13. The chemical vapor deposition apparatus according to claim 12, wherein the first process source material is $H_2O$, and the second process source material is diethyl zinc.

14. A chemical vapor deposition apparatus comprising:
    a chamber with a substrate-supporting member for supporting a substrate;
    a chamber lid installed over the chamber comprising a plurality of first source supplying holes;
    a plurality of source supplying pipes arranged at fixed intervals;
    a source spraying member for spraying an externally-provided process source material onto the substrate, the source spraying member detachably installed in the chamber lid and comprising a spraying-pipe supporting member supporting the plurality of source supplying pipes and having a plurality of second source supplying holes corresponding to the plurality of first source supplying holes; and
    a cooling member for cooling a temperature of the source spraying member, the cooling member installed inside the chamber lid.

15. The chemical vapor deposition apparatus according to claim 14, wherein the chamber lid further comprises:
   a base
      having the plurality of first source supplying holes at fixed intervals therein, wherein the plurality of first source supplying holes is configured to supply the process source material to the source spraying member;
   a supporting-member installation portion in which the source spraying member is detachably installed, the supporting-member installation portion in a rear or interior surface of the base; and
   a cooling-member installation portion in the base in which the cooling member is installed.

16. The chemical vapor deposition apparatus according to claim 15, wherein the source spraying member comprises:
   the spraying-pipe supporting member detachably installed in the base;
   a plurality of third source supplying holes in the plurality of source spraying pipes that correspond to the plurality of second source supplying holes; and
   a plurality of source spraying holes at fixed intervals in the plurality of source spraying pipes, the plurality of source spraying holes provided for spraying the process source material onto the substrate.

17. The chemical vapor deposition apparatus according to claim 16, further comprising a jacket with a plurality of openings corresponding to the plurality of source spraying pipes, the jacket detachably installed in the rear or interior surface of the chamber lid.

18. The chemical vapor deposition apparatus according to claim 17, wherein each of the plurality of openings has a rectangular shape corresponding to a shape of one of the plurality of source spraying pipes, or a hole shape corresponding to one of the plurality of source supplying holes.

19. The chemical vapor deposition apparatus according to claim 16, further comprising a sealing member for sealing connections between the plurality of first source supplying holes and the plurality of source supplying pipes.

20. The chemical vapor deposition apparatus according to claim 16, wherein the plurality of source supplying pipes comprises from 2 to 500 source supplying pipes.

21. The chemical vapor deposition apparatus according to claim 15, wherein the supporting-member installation portion comprises:
   first insertion grooves parallel to each other in the rear or interior surface of the base, in which the spraying-pipe supporting member is detachably installed; and
   a plurality of second insertion grooves arranged at fixed intervals in the rear or interior surface of the base and perpendicular to the first insertion grooves, wherein the plurality of source spraying pipes are installed in the plurality of second insertion grooves.

22. The chemical vapor deposition apparatus according to claim 15, wherein the cooling-member installation portion comprises grooves in a pattern having multiple bends in an upper surface of the base.

23. The chemical vapor deposition apparatus according to claim 15, further comprising a cover for covering the cooling member and the cooling-member installation portion in which the cooling member is installed.

24. The chemical vapor deposition apparatus according to claim 15, further comprising a plurality of source supplying pipes for supplying the process source material to the plurality of first source supplying holes.

25. The chemical vapor deposition apparatus according to claim 24, wherein the plurality of source supplying pipes comprise:
   a first source supplying pipe for supplying a first process source material to a first set of the first source supplying holes; and
   a second source supplying pipe for supplying a second process source material to a second set of the first source supplying holes, the second set of the first source supplying holes differing from the first set of the first source supplying holes.

26. The chemical vapor deposition apparatus according to claim 25, wherein the first process source material is $H_2O$, and the second process source material is diethyl zinc.

27. The chemical vapor deposition apparatus according to claim 14, wherein the cooling member cools the spraying-pipe supporting member to a constant temperature by circulating an externally-provided cooling fluid.

* * * * *